US012525925B2

(12) United States Patent
Torii

(10) Patent No.: US 12,525,925 B2
(45) Date of Patent: Jan. 13, 2026

(54) TEMPERATURE COMPENSATION CIRCUIT

(71) Applicant: Mitsubishi Electric Corporation, Tokyo (JP)

(72) Inventor: Takuma Torii, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 441 days.

(21) Appl. No.: 18/198,118

(22) Filed: May 16, 2023

(65) Prior Publication Data

US 2023/0291362 A1    Sep. 14, 2023

Related U.S. Application Data

(63) Continuation of application No. PCT/JP2021/004011, filed on Feb. 4, 2021.

(51) Int. Cl.
*H03F 1/30* (2006.01)
*H03F 3/21* (2006.01)

(52) U.S. Cl.
CPC ............. *H03F 1/301* (2013.01); *H03F 3/21* (2013.01); *H03F 2200/447* (2013.01); *H03F 2200/451* (2013.01)

(58) Field of Classification Search
CPC ............. H03F 1/30; H03F 3/20; H03G 3/30
USPC .......................................... 330/289, 296, 285
See application file for complete search history.

(56) References Cited

U.S. PATENT DOCUMENTS

| 6,087,888 A | 7/2000 | Inokuchi |
| 2018/0241349 A1 | 8/2018 | Ishihara et al. |
| 2019/0229681 A1 | 7/2019 | Ishihara et al. |
| 2020/0336106 A1 | 10/2020 | Ishihara et al. |

FOREIGN PATENT DOCUMENTS

| JP | 11-150424 A | 6/1999 |
| JP | 2001-320242 A | 11/2001 |
| JP | 2003-188653 A | 7/2003 |
| JP | 2018-133778 A | 8/2018 |

OTHER PUBLICATIONS

International Search Report for PCT/JP2021/004011 filed on Feb. 4, 2021, and mailed on Apr. 13, 2021.

*Primary Examiner* — Henry Choe
(74) *Attorney, Agent, or Firm* — BIRCH, STEWART, KOLASCH & BIRCH, LLP

(57) ABSTRACT

Disclosed is a temperature compensation circuit including: a first current path to perform temperature compensation on a second transistor in a first temperature range; and a second current path having a diode which goes to an on state in a second temperature range higher than the first temperature range, to perform temperature compensation on the second transistor by means of a current flowing through the diode in the on state.

4 Claims, 2 Drawing Sheets

TEMPERATURE COMPENSATION CIRCUIT

CROSS REFERENCE TO RELATED APPLICATION

This application is a Continuation of PCT International Application No. PCT/JP2021/004011, filed on Feb. 4, 2021, which is hereby expressly incorporated by reference into the present application.

TECHNICAL FIELD

The present disclosure relates to a temperature compensation circuit.

BACKGROUND ART

It is demanded that power amplifiers have a gain which does not greatly vary even though they are made to operate under various temperature conditions. A transistor is used as an amplifying element of a power amplifier, and the gain of the power amplifier varies dependently upon the temperature characteristic of the transistor. As for a conventional technology of compensating for variations in the gain of a power amplifier with respect to variations in temperature, a temperature compensation circuit which generates a bias voltage for compensating for the temperature dependence of the gain of a transistor and a drain current is described in, for example, Patent Literature 1.

CITATION LIST

Patent Literature

Patent Literature 1: JP 2003-188653 A

SUMMARY OF INVENTION

Technical Problem

In the temperature compensation circuit described in Patent Literature 1, in a case of having a characteristic in which the threshold voltage of the transistor decreases with increasing temperature, the current flowing through the circuit increases with increasing temperature, and the source potential of the transistor which controls the current flowing through the circuit increases. As a result, the conventional temperature compensation circuit has a problem in which the current flowing through the circuit becomes zero or converges to a constant value under high temperature conditions, and therefore it becomes impossible for the temperature compensation circuit to perform temperature compensation.

The present disclosure is made to solve the above-mentioned problem, and it is therefore an object of the present disclosure to obtain a temperature compensation circuit that can perform temperature compensation even under wide range temperature conditions containing high temperature conditions.

Solution to Problem

A temperature compensation circuit according to the present disclosure includes: a first current path to perform temperature compensation on a power amplifier in a first temperature range; and a second current path having a rectifying element which goes to an on state in a second temperature range higher than the first temperature range, to perform temperature compensation on the power amplifier by means of a current flowing through the rectifying element in the on state, in which the first current path includes: a first transistor having a control terminal, a first terminal, and a second terminal; a first resistor having one end connected to the first terminal of the first transistor, and having a characteristic in which a resistance value of the first resistor increases with increasing temperature; a second resistor having one end connected to another end of the first resistor, and another end connected to a voltage input terminal; and a third resistor having one end grounded and another end connected to the second terminal of the first transistor, in which a point of connection between the first resistor and the second resistor is connected, via an isolation resistor, to a control terminal of a second transistor which is the power amplifier, and the second current path includes: a fourth resistor having one end connected to the point of connection between the first resistor and the second resistor, and another end connected to the control terminal of the first transistor; and the rectifying element having one end connected to a point of connection between the control terminal of the first transistor and the fourth resistor, and another end connected to the voltage input terminal, in which the current flows through the rectifying element when the rectifying element is in the on state.

Advantageous Effects of Invention

According to the present disclosure, because the current flowing through the circuit does not become zero and does not converge to a constant value because of the compensating current from the second current path under high temperature conditions, temperature compensation can be performed even under wide range temperature conditions containing high temperature conditions.

DESCRIPTION OF EMBODIMENTS

Embodiment 1

Figure 1:
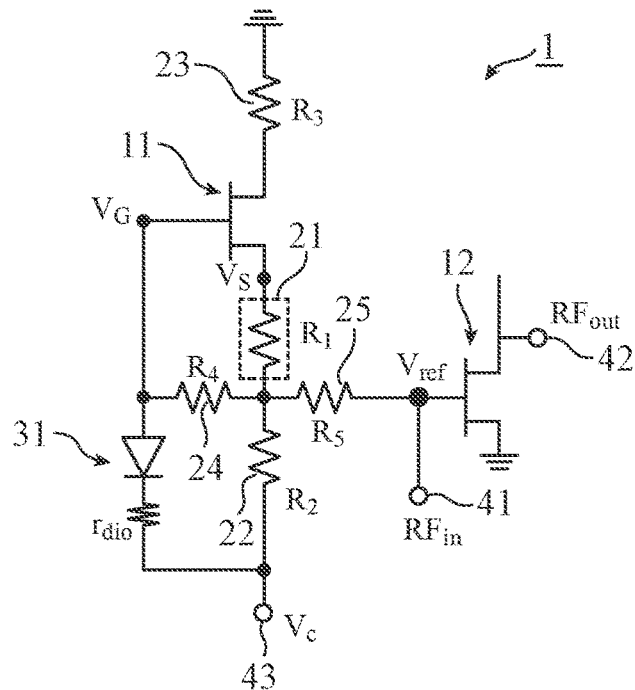
FIG. 1 is a circuit diagram showing an example of the configuration of a temperature compensation circuit according to Embodiment 1.

FIG. 1 is a circuit diagram showing an example of the configuration of a temperature compensation circuit 1 according to Embodiment 1. The temperature compensation circuit 1 shown in FIG. 1 compensates for the temperature dependence of the gain of a power amplifier, and includes a first transistor 11, a first resistor 21, a second resistor 22, a third resistor 23, a fourth resistor 24, a fifth resistor 25, a diode 31, and a voltage input terminal 43. In FIG. 1, the power amplifier which is a target for temperature compensation is a second transistor 12. The second transistor 12 is a field effect transistor, and includes a gate terminal which is a control terminal, a source terminal, and a drain terminal.

To the gate terminal of the second transistor 12 is connected an input terminal 41, the source terminal is grounded, and to the drain terminal is connected an output terminal 42. To the input terminal 41 is inputted a high frequency signal $RF_{in}$, and the high frequency signal is supplied to the gate terminal of the second transistor 12. A high frequency signal $RF_{out}$ resulting from the amplification of the high frequency signal $RF_{in}$ by the second transistor 12 is outputted from the output terminal 42.

The first transistor 11 is a field effect transistor, and includes a gate terminal which is a control terminal to which a gate voltage $V_G$ is supplied, a source terminal which is a first terminal to which a source voltage $V_S$ is applied, and a drain terminal which is a second terminal. The first resistor 21 has a temperature characteristic in which a resistance value $R_1$ of the first resistor increases with increasing temperature, and has one end connected to the source terminal of the first transistor 11 and another end connected to a point of connection between the fourth resistor 24 and the fifth resistor 25. The second resistor 22 has a resistance value $R_2$, and has one end connected to the other end of the first resistor 21 and another end connected to the voltage input terminal 43. The third resistor 23 has a resistance value $R_3$, and has one end grounded and another end connected to the drain terminal of the first transistor 11. To the voltage input terminal 43 is applied a DC voltage $V_c$.

The fourth resistor 24 has a resistance value $R_4$, and has one end connected to a point of connection between the first resistor 21 and the second resistor 22 and another end connected to the gate terminal of the first transistor 11 and an anode of the diode 31. The diode 31 is a rectifying element containing an internal resistance $r_{dio}$, and has the anode terminal which is one end is connected to a point of connection between the gate terminal of the first transistor 11 and the fourth resistor 24 and a cathode terminal which is another end is connected to the voltage input terminal 43. A current $I_{dio}$ flows through the diode 31 when the diode goes to an on state. The fourth resistor 24 causes an electric potential difference $I_{dio}R_4$ to occur by means of the current $I_{dio}$ flowing through the diode 31.

The first transistor 11, the first resistor 21, the second resistor 22, and the third resistor 23 form a first current path. In the first current path, the point of connection between the first resistor 21 and the second resistor 22 is connected to the gate terminal of the second transistor 12 via the fifth resistor 25. An output voltage $V_{ref}$ is supplied from the point of connection between the first resistor 21 and the second resistor 22, via the fifth resistor 25, to the gate terminal of the second transistor 12. The fifth resistor 25 is an isolation resistor for coupling the electric potential at the point of connection between the first resistor 21 and the second resistor 22 to the gate terminal of the second transistor 12.

The fourth resistor 24 and the diode 31 form a second current path. The second current path operates in a second temperature range higher than a first temperature range in which the first current path operates.

More specifically, the temperature compensation circuit 1 compensates for the temperature dependence of the gain of the second transistor 12, in the first temperature range, by means of the first current path, and, when the ambient temperature increases and falls within the second temperature range, the diode 31 goes to the on state and the temperature compensation circuit 1 compensates for the temperature dependence of the gain of the second transistor 12 by means of the second current path.

Figure 2:
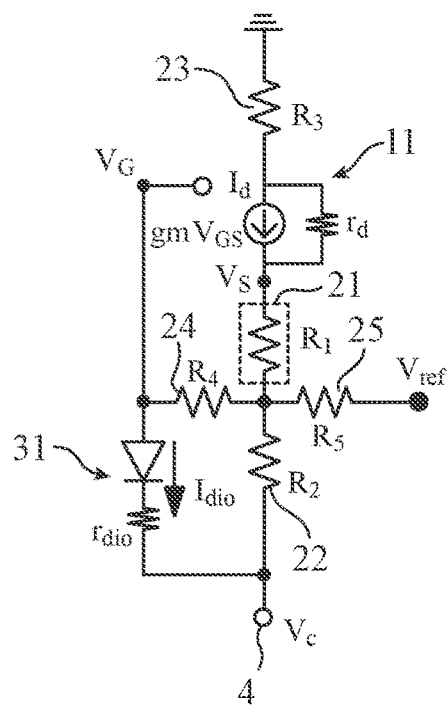
FIG. 2 is a circuit diagram showing an equivalent circuit of the temperature compensation circuit of FIG. 1.

FIG. 2 is a circuit diagram showing an equivalent circuit of the temperature compensation circuit 1 of FIG. 1. In FIG. 2, the first transistor 11 is transformed into an equivalent circuit using a transconductance gm and a drain-to-source resistance $r_d$. An internal current source of the first transistor 11 is expressed by $gmV_{GS}$ using the transconductance gm and a gate-to-source voltage $V_{GS}$.

When the diode 31 is in an off state, the current $I_d$ flowing through the first transistor 11 is expressed by the following equation (1). $V_{th}$ is a threshold voltage of the first transistor 11, and $V_c$ is the DC voltage applied to the voltage input terminal 43.

$$-I_d = \frac{gmr_d V_{th} + V_c}{R_1 + R_2 + R_3 + r_d + gmr_d R_1} \quad (1)$$

Assuming that $r_d \approx \infty$ holds, the above-mentioned equation (1) is transformed into the following equation (2).

$$-I_d = \frac{V_{th}}{1/gm + R_1} \quad (2)$$

The output voltage $V_{ref}$ outputted from the point of connection between the first resistor 21 and the second resistor 22, via the fifth resistor 25, to the gate terminal of the second transistor 12 is expressed by the following equation (3). It can be seen from the following equation (3) that when the threshold voltage $V_{th}$ of the first transistor 11, the transconductance gm of the first transistor 11, and the resistance value $R_1$ of the first resistor 21 have temperature characteristics, the temperature dependence of the output voltage $V_{ref}$ is determined by the tendency of a variation in each of the following quantities: $V_{th}$, gm, and $R_1$ with respect to temperature.

$$V_{ref} = \frac{V_{th}}{1/gm + R_1} R_2 + V_c \quad (3)$$

In a case where the threshold voltage $V_{th}$ has a temperature characteristic in which the threshold voltage decreases with increasing temperature, the temperature compensation circuit 1 can compensate for the temperature dependence of the threshold voltage of the second transistor 12 if the output voltage $V_{ref}$ has a temperature characteristic in which the output voltage decreases with increasing temperature.

For example, in a case where it is assumed that the resistance value $R_1$ varies in direct proportion to temperature, and the transconductance gm varies in inverse proportion to temperature, the numerator in the first term on the right side of the above-mentioned equation (3) varies in inverse proportion to temperature, and the denominator in the first term on the right side of the above-mentioned equation (3) varies in direct proportion to temperature. Therefore, the value shown by the first term on the right side of the above-mentioned equation (3) continuously varies in inverse proportion to temperature.

In the first term on the right side of the above-mentioned equation (3), when the denominator becomes sufficiently large compared to the numerator with increasing temperature, the variation of the value expressed by the first term on the right side of the above-mentioned equation (3) with respect to temperature becomes small, and the variation of the output voltage $V_{ref}$ with respect to temperature also becomes small. Considering the above-mentioned equation (2) in the same way, it is seen that the variation of the current $I_d$ with respect to temperature becomes small. More specifically, when the variation of the current $I_d$ with respect to temperature becomes small, it becomes impossible for the temperature compensation circuit 1 to perform temperature compensation on the second transistor 12.

In a case where it is assumed that the resistance value $R_1$ varies in direct proportion to temperature, and the first transistor 11 is biased to so-called shallow class AB closer to class A than to class B, the threshold voltage $V_{th}$ decreases with increasing temperature, and, as a result, the current $I_d$ increases and the transconductance gm varies in direct proportion to temperature. At this time, in a case where the variation of 1/gm in the denominator in the first term on the right side of the above-mentioned equation (3) with respect to temperature is set in such a way as to be smaller than the variation of the resistance value $R_1$ with respect to temperature, the output voltage $V_{ref}$ varies in inverse proportion to temperature.

When the transconductance gm increases with increasing temperature and becomes a maximum, the transconductance gm changes, after that, to a state of varying in inverse proportion to temperature. At this time, when in the first term on the right side of the above-mentioned equation (3), the denominator becomes sufficiently large compared to the numerator with increasing temperature, the variation of the value exhibited by the first term on the right side of the above-mentioned equation (3) with respect to temperature becomes small, and the variation of the output voltage $V_{ref}$ with respect to temperature also becomes small. In this case, because the variation of the current $I_d$ with respect to temperature becomes small, it becomes impossible for the temperature compensation circuit 1 to perform temperature compensation on the second transistor 12.

If the output voltage $V_{ref}$ varies in direct proportion to temperature when the threshold voltage $V_{th}$ of the first transistor 11 varies in direct proportion to temperature, the temperature compensation circuit 1 can compensate for the temperature dependence of the threshold voltage of the second transistor 12.

For example, in a case where it is assumed that the resistance value $R_1$ varies in direct proportion to temperature, and the transconductance gm varies in inverse proportion to temperature, the denominator in the first term on the right side of the above-mentioned equation (3) varies in direct proportion to temperature, and the output voltage $V_{ref}$ varies in direct proportion to temperature in a temperature range in which the variation of the denominator is larger than the variation of the numerator.

Also when the variation of the transconductance gm becomes small with increasing temperature, the threshold voltage $V_{th}$ of the first transistor 11 continuously varies with respect to temperature, and, as a result, the output voltage $V_{ref}$ continuously has a positive slope with respect to temperature.

In a case where it is assumed that the resistance value $R_1$ varies in direct proportion to temperature, and the first transistor 11 is biased to shallow class AB, the current $I_d$ varies in inverse proportion to temperature, and therefore the transconductance gm varies in inverse proportion to temperature. At this time, the output voltage $V_{ref}$ continuously varies in direct proportion to temperature.

When the diode 31 goes to the on state, the current $I_{dio}$ flows through the diode 31, a voltage drop occurs in the fourth resistor 24, and it becomes possible to control the gate-to-source voltage $V_{GS}$ of the first transistor 11. Because the diode 31 contains the internal resistance $r_{dio}$, an electric potential difference occurs in the diode 31 and the diode 31 is not short-circuited even when the diode goes to the on state. At this time, the current $I_d$ flowing through the first transistor 11 is expressed by the following equation (4).

$$-I_d = \frac{gmr_d(V_{th} + R_4 I_{dio}) + V_c}{R_1 + R_2 + R_3 + r_d + gmr_d R_1} \quad (4)$$

Assuming that $r_d \approx \infty$ holds, the above-mentioned equation (4) is transformed into the following equation (5).

$$-I_d = \frac{V_{th} + I_{dio} R_4}{1/gm + R_1} \quad (5)$$

When a comparison between the above-mentioned equation (5) and the above-mentioned equation (2) is made, the current $I_d$ flowing through the first transistor 11 is compensated for by means of $I_{dio} R_4$ in the above-mentioned equation (5). As mentioned above, even when the variation of the current $I_d$ with respect to temperature becomes small, the temperature compensation circuit 1 can perform temperature compensation on the second transistor 12 by means of the current $I_{dio}$ flowing through the diode 31.

At this time, the output voltage $V_{ref}$ can be expressed by the following equation (6).

$$V_{ref} = \left(\frac{V_{th} + I_{dio} R_4}{1/gm + R_1} - I_{dio}\right) R_2 + V_c \quad (6)$$

In a case where it is assumed that the threshold voltage $V_{th}$ of the first transistor 11 varies in inverse proportion to temperature, the resistance value $R_1$ varies in direct proportion to temperature, and the transconductance gm varies in inverse proportion to temperature, the variation of the current $I_d$ with respect to temperature becomes small, as mentioned above. However, because the current $I_d$ is compensated for by means of the current $I_{dio}$ flowing through the diode 31, and the current $I_d$ continuously varies with respect to temperature, the temperature compensation circuit 1 can perform temperature compensation on the second transistor 12.

Further, in a case where it is assumed that the resistance value $R_1$ varies in direct proportion to temperature, and the first transistor 11 is biased to shallow class AB, the variation of the current $I_d$ with respect to temperature becomes small, as mentioned above. However, because the current $I_d$ is compensated for by means of the current $I_{dio}$ flowing through the diode 31, and the current $I_d$ continuously varies with respect to temperature, the temperature compensation circuit 1 can perform temperature compensation on the second transistor 12.

In addition, when the threshold voltage $V_{th}$ of the first transistor 11 varies in direct proportion to temperature, the resistance value $R_1$ varies in direct proportion to temperature, and the transconductance gm varies in inverse proportion to temperature, the output voltage $V_{ref}$ continuously varies in direct proportion to temperature, as mentioned above.

However, in the second temperature range in which the diode 31 is in the on state, the output voltage $V_{ref}$ varies with respect to temperature because of the current compensation which uses the current $I_{dio}$ flowing through the diode 31.

More specifically, the temperature compensation circuit 1 can set the slope of the variation of the output voltage $V_{ref}$ with respect to temperature, separately for the first temperature range in which the diode 31 is in the off state and for the second temperature range in which the diode 31 is in the on state.

Also in a case where it is assumed that the resistance value $R_1$ varies in direct proportion to temperature, and the first transistor 11 is biased to shallow class AB, the temperature compensation circuit 1 can set the slope of the variation of the output voltage $V_{ref}$ with respect to temperature, separately for the first temperature range in which the diode 31 is in the off state and for the second temperature range in which the diode 31 is in the on state.

Figure 3:
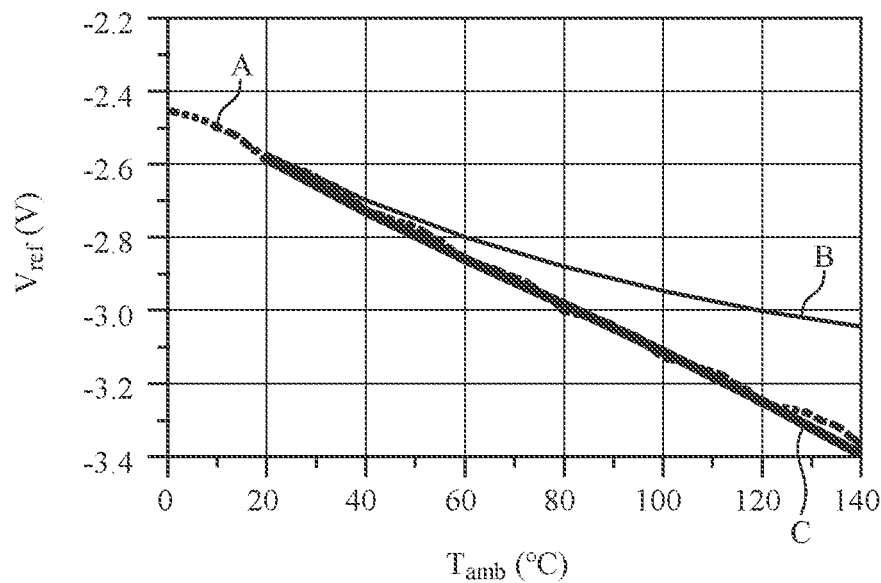
FIG. 3 is a graph showing results of simulations of the temperature dependence of the output voltage of the temperature compensation circuit.

FIG. 3 is a graph showing results of simulations of the temperature dependence of the output voltage $V_{ref}$ of the temperature compensation circuit. The simulation results shown in FIG. 3 show the temperature dependence of the output voltage $V_{ref}$ in a conventional temperature compensation circuit and in the temperature compensation circuit 1 in a case where the threshold voltage $V_{th}$ of the first transistor 11 varies in inverse proportion to temperature, the resistance value $R_1$ varies in direct proportion to temperature, and the first transistor 11 is biased to shallow class AB. The conventional temperature compensation circuit does not include the second current path in the temperature compensation circuit 1.

A constant gain line A shown by a broken line in FIG. 3 denotes a voltage characteristic in a case where the gain of the power amplifier (second transistor 12) is fixed with respect to temperature. In FIG. 3, a relation between an environmental temperature $T_{amb}$ and the output voltage $V_{ref}$, the relation being denoted by a reference character B, is a result of a simulation of the temperature characteristic of the output voltage $V_{ref}$ of the conventional temperature compensation circuit. Further, a relation between the environmental temperature $T_{amb}$ and the output voltage $V_{ref}$, the relation being denoted by a reference character C, is a result of a simulation of the temperature characteristic of the output voltage $V_{ref}$ of the temperature compensation circuit 1.

In the conventional temperature compensation circuit, the output voltage $V_{ref}$ has a small variation with respect to temperature when the environmental temperature $T_{amb}$ is higher than or equal to 60° C., as shown by the relation denoted by the reference character B. In contrast with this, in the temperature compensation circuit 1, there is provided a constant slope even when the environmental temperature $T_{amb}$ reaches 140° C., as shown by the relation denoted by the reference character C.

Figure 4:
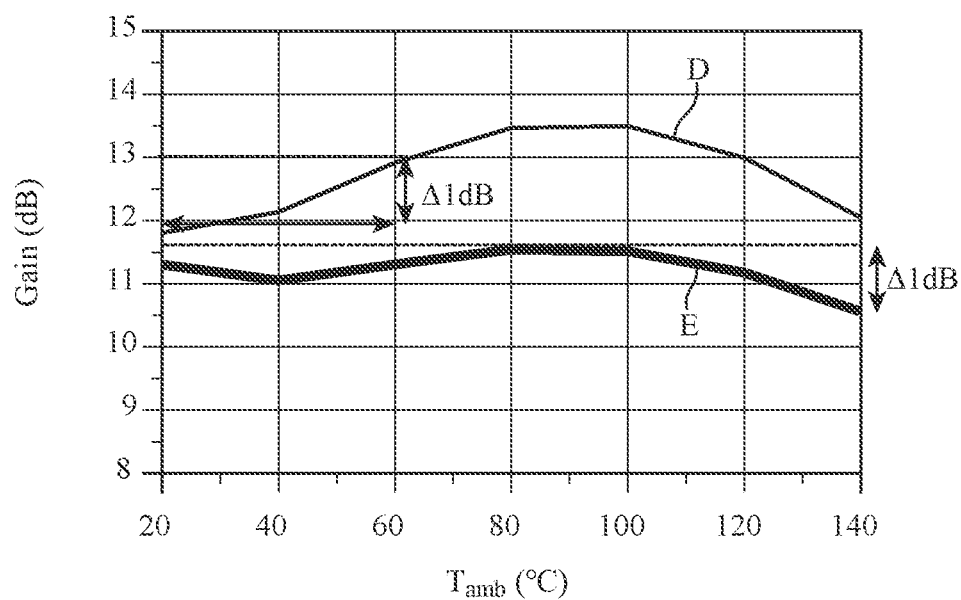
FIG. 4 is a graph showing results of simulations of the temperature dependence of the gains of power amplifiers.

FIG. 4 is a graph showing results of simulations of the temperature dependence of the gain of the power amplifier (second transistor 12). The simulation results shown in FIG. 4 show the temperature dependence of the gain of the second transistor 12 on which temperature compensation is performed by the conventional temperature compensation circuit and the temperature dependence of the gain of the second transistor 12 on which temperature compensation is performed by the temperature compensation circuit 1 in the case where the threshold voltage $V_{th}$ of the first transistor 11 varies in inverse proportion to temperature, the resistance value $R_1$ varies in direct proportion to temperature, and the first transistor 11 is biased to shallow class AB. The conventional temperature compensation circuit does not include the second current path in the temperature compensation circuit 1, like in the case shown in FIG. 3.

In FIG. 4, a relation of the gain with respect to the environmental temperature $T_{amb}$, the relation being denoted by a reference character D, shows a simulation result of the temperature characteristic of the gain of the second transistor 12 on which temperature compensation is performed by the conventional temperature compensation circuit. Further, a relation of the gain with respect to the environmental temperature $T_{amb}$, the relation being denoted by a reference character E, shows a simulation result of the temperature characteristic of the gain of the second transistor 12 on which temperature compensation is performed by the temperature compensation circuit 1.

As shown by the relation denoted by the reference character D, the range of environmental temperature $T_{amb}$ in which the second transistor 12 has a 1 dB gain variation in the conventional temperature compensation circuit is from 20° C. to 60° C. In contrast with this, as shown by the relation denoted by the reference character E, the range of environmental temperature $T_{amb}$ in which the second transistor 12 has a 1 dB gain variation in the temperature compensation circuit 1 is from 20° C. to 140° C. Thus, the temperature compensation circuit 1 can perform temperature compensation even under wide range temperature conditions containing high temperature conditions.

In the above explanation, although the case where the first transistor 11 and the second transistor 12 are field effect transistors is shown, the first and second transistors may be other types of transistors. For example, the first transistor 11 and the second transistor 12 may be bipolar junction transistors. Further, the diode 31 has only to be a rectifying element through which a current flows when going to the on state.

As mentioned above, the temperature compensation circuit 1 according to Embodiment 1 includes: the first current path to perform temperature compensation on the second transistor 12 in the first temperature range; and the second current path having the diode 31 which goes to the on state in the second temperature range higher than the first temperature range, to perform temperature compensation on the second transistor 12 by means of the current flowing through the diode 31 in the on state. Because the current flowing through the circuit does not become zero and does not converge to a constant value because of the compensating current from the second current path under high temperature conditions, temperature compensation can be performed even under wide range temperature conditions containing high temperature conditions.

In the temperature compensation circuit 1 according to Embodiment 1, the first current path includes: the first transistor 11; the first resistor 21 having one end connected to the source terminal of the first transistor 11, and having a characteristic in which a resistance value $R_1$ of the first resistor increases with increasing temperature; the second resistor 22 having one end connected to another end of the first resistor 21, and another end connected to the voltage input terminal 43; and the third resistor 23 having one end grounded and another end connected to the drain terminal of the first transistor 11, in which the point of connection between the first resistor 21 and the second resistor 22 is connected to the gate terminal of the second transistor 12 via the fifth resistor 25, and the second current path includes: the fourth resistor 24 having one end connected to the point of connection between the first resistor 21 and the second resistor 22, and another end connected to the gate terminal of the first transistor 11; and the diode 31 having one end connected to the point of connection between the gate terminal of the first transistor 11 and the fourth resistor 24, and another end connected to the voltage input terminal 43, in which a current flows through the diode when the diode is in the on state. Because the current flowing through the circuit does not become zero and does not converge to a constant value because of the compensating current from the second current path under high temperature conditions, temperature compensation can be performed even under wide range temperature conditions containing high temperature conditions.

It is to be understood that changes can be made in any component of the embodiment, or any component of the embodiment can be omitted.

INDUSTRIAL APPLICABILITY

The temperature compensation circuit according to the present disclosure can be used for, for example, temperature compensation on high frequency amplifying circuits which amplify the power of a high frequency signal.

REFERENCE SIGNS LIST

1 temperature compensation circuit, 11 first transistor, 12 second transistor, 21 first resistor, 22 second resistor, 23 third resistor, 24 fourth resistor, 25 fifth resistor, 31 diode, 41 input terminal, 42 output terminal, and 43 voltage input terminal.

The invention claimed is:

1. A temperature compensation circuit comprising:
a first current path to perform temperature compensation on a power amplifier in a first temperature range; and
a second current path having a rectifying element which goes to an on state in a second temperature range higher than the first temperature range, to perform temperature compensation on the power amplifier by means of a current flowing through the rectifying element in the on state, wherein
the first current path includes:
a first transistor having a control terminal, a first terminal, and a second terminal;
a first resistor having one end connected to the first terminal of the first transistor, and having a characteristic in which a resistance value of the first resistor increases with increasing temperature;
a second resistor having one end connected to another end of the first resistor, and another end connected to a voltage input terminal; and
a third resistor having one end grounded and another end connected to the second terminal of the first transistor,
wherein a point of connection between the first resistor and the second resistor is connected, via an isolation resistor, to a control terminal of a second transistor which is the power amplifier, and
the second current path includes:
a fourth resistor having one end connected to the point of connection between the first resistor and the second resistor, and another end connected to the control terminal of the first transistor; and
the rectifying element having one end connected to a point of connection between the control terminal of the first transistor and the fourth resistor, and another end connected to the voltage input terminal, wherein the current flows through the rectifying element when the rectifying element is in the on state.

2. The temperature compensation circuit according to claim 1, wherein the first transistor has a characteristic in which a threshold voltage of the first transistor decreases with increasing temperature.

3. The temperature compensation circuit according to claim 1, wherein the first transistor is biased to class AB.

4. The temperature compensation circuit according to claim 2, wherein the first transistor is biased to class AB.

* * * * *